(12) United States Patent
Franzon et al.

(10) Patent No.: US 6,885,090 B2
(45) Date of Patent: Apr. 26, 2005

(54) INDUCTIVELY COUPLED ELECTRICAL CONNECTORS

(75) Inventors: Paul D. Franzon, Holly Springs, NC (US); Stephen E. Mick, Apex, NC (US); John M. Wilson, Raleigh, NC (US)

(73) Assignee: North Carolina State University, Raleigh, NC (US)

( * ) Notice: Subject to any disclaimer, the term of this patent is extended or adjusted under 35 U.S.C. 154(b) by 214 days.

(21) Appl. No.: 09/997,586

(22) Filed: Nov. 28, 2001

(65) Prior Publication Data

US 2003/0100200 A1 May 29, 2003

(51) Int. Cl.⁷ .............................................. H01L 23/02
(52) U.S. Cl. ...................... 257/678; 257/684; 257/724; 257/777; 257/778; 438/106; 438/107; 438/108; 438/109
(58) Field of Search ................................ 257/676, 678, 257/684, 724, 777, 778; 438/106–109

(56) References Cited

U.S. PATENT DOCUMENTS

| 5,629,838 | A |   | 5/1997 | Knight et al. ............... 361/782 |
| 6,175,124 | B1 |  | 1/2001 | Cole et al. .................... 257/48 |
| 6,362,972 | B1 |  | 3/2002 | Panella |
| 6,529,385 | B1 | * | 3/2003 | Brady et al. ................. 361/766 |

OTHER PUBLICATIONS

Sim et al., *A 1–Gb/s Bidirectional I/O Buffer Using the Current–Mode Scheme*, IEEE Journal of Solid–State Circuits, vol. 34, No. 4, Apr. 1999, pp. 529–535.
Duewer et al., *MEMS–Based Capacitor Arrays for Programmable Interconnected and RF Applications*, IEEE, Proceedings of the 20th Anniversary Conference on Advanced Research in VLSI, Mar. 1999, pp. 369–377.
Poulton, *Signaling in High–Performance Memory Systems*, IEEE ISSCC 1999.
Arabi et al., *Modeling Simulation, and Design Methodology of the Interconnect and Packaging of an Ultra–High Speed Source Synchronous Bus*, IEEE, 7ᵗʰ Topical Meeting On Electrical Performance Of Electronic Packaging, 1998, pp. 8–11.
Gabara et al., Capacitive *Coupling and Quantized Feedback Applied to Conventional CMOS Technology*, IEEE Journal of Solid–State Circuits, vol. 32, No. 3, Mar. 1997, pp. 419–427.
Salzman et al., Capacitive *Coupling Solves the Known Good Die Problem*, Proceedings of the IEEE MCMC, 1994, pp. 95–99.
Annotated copy of U.S. Patent No. 5,629,838 to Knight et al., issued May 13, 1997.

* cited by examiner

Primary Examiner—Hsien Ming Lee
(74) Attorney, Agent, or Firm—Myers Bigel Sibley & Sajovec (57) ABSTRACT

Microelectronic packages include a first microelectronic substrate having a first face and a first AC-coupled interconnect element on the first face. A second microelectronic substrate includes a second face and a second AC-coupled interconnect element on the second face. A buried solder bump extends between the first and second faces, and is at least partially buried beneath the first and/or second faces, to maintain the first and second AC-coupled interconnect elements in closely spaced apart relation. The buried solder bump also may couple DC power between the first and second substrates. Other technologies also may be used to maintain the AC-coupled interconnect elements in closely spaced apart relation and to couple DC power between the substrates. The first and second AC-coupled interconnect elements may be first and second capacitor plates, first and second inductors and/or first and second combined inductive and capacitive elements.

30 Claims, 5 Drawing Sheets

INDUCTIVELY COUPLED ELECTRICAL CONNECTORS

FIELD OF THE INVENTION

This invention relates to microelectronic devices, and more particularly to microelectronic packages for microelectronic devices.

BACKGROUND OF THE INVENTION

Microelectronic devices, such as integrated circuit chips, are widely used in consumer and commercial applications. As the integration density of microelectronic devices continues to increase, it may become increasingly difficult to provide a sufficient quantity of high performance interconnects that connect the microelectronic device to a next level package. The interconnects may be used to transfer signals and/or power. Accordingly, the interconnect density and/or performance may be a limiting factor in the further integration of microelectronic devices.

It is known to provide Alternating Current (AC)-coupled interconnects for microelectronic devices. These AC-coupled interconnects may be characterized by the absence of a Direct Current (DC) connection. Instead, AC-coupled interconnects use inductive and/or capacitive coupling between spaced apart inductive and/or capacitive elements, to provide interconnects. AC-coupled interconnects are described, for example, in U.S. Pat. No. 5,629,838 to Knight et al., entitled *Apparatus for Non-Conductively Interconnecting Integrated Circuits Using Half Capacitors*, and U.S. Pat. No. 6,175,124 to Cole et al., entitled *Method and Apparatus for a Wafer Level System*.

In order to allow high performance AC-coupled microelectronic interconnects, it may be desirable to maintain close spacing and/or closely controlled alignment between AC-coupled interconnect elements on adjacent faces of microelectronic substrates. However, it may be difficult to provide this close spacing/alignment between the closely spaced apart AC-coupled interconnect elements in a reliable and/or repeatable manner. It also may be difficult to couple DC power, such as a power supply voltage and/or ground voltage, across the AC-coupled interconnect elements. Finally, the capacitive coupling may present an excessively high equivalent impedance.

SUMMARY OF THE INVENTION

Embodiments of the present invention can use buried solder bumps to provide spacing for AC-coupled microelectronic interconnects. Buried solder bumps, according to embodiments of the invention, can provide means for maintaining first and second AC-coupled interconnect elements spaced apart from one another by a distance that is less than the solder bump thickness. Thus, relatively thick solder bumps can be used to maintain sufficient compliance while maintaining the AC-coupled microelectronic interconnects in closely spaced apart relation and/or alignment.

More specifically, microelectronic packages according to some embodiments of the invention include a first microelectronic substrate having a first face and a first AC-coupled interconnect element on the first face. A second microelectronic substrate includes a second face and a second AC-coupled interconnect element on the second face. A buried solder bump extends between the first and second faces, and is at least partially buried beneath at least one of the first and second faces, to maintain the first and second AC-coupled interconnect elements in closely spaced apart relation.

In some embodiments, the first and second AC-coupled interconnect elements comprise respective first and second capacitor plates. In other embodiments, the first and second AC-coupled interconnect elements comprise first and second inductors, respectively. In still other embodiments, the first and second AC-coupled interconnect elements comprise first and second combined inductive and capacitive elements, respectively. These combined inductive and capacitive elements may be tuned to provide a broad-frequency impedance match.

Buried solder bumps may be provided, according to some embodiments of the invention, by providing a trench in the second face of the second microelectronic substrate including a trench floor beneath the second face. The buried solder bump extends between the trench floor and the first face of the first microelectronic substrate. In other embodiments, a first trench is provided in the first face including a first trench floor beneath the first face. A second trench is provided in the second face including a second trench floor beneath the second face. The buried solder bump extends between the first trench and the second trench floor. In any of the above embodiments, solder bump pads may be provided for the buried solder bump.

In some embodiments of the invention, the first microelectronic substrate is an integrated circuit, also referred to as a chip, and the second microelectronic substrate is a second level package for the integrated circuit, such as a Multi-Chip Module (MCM), Printed Circuit Board (PCB) and/or other second level package. In other embodiments, the first and second substrates are mating connector substrates including mating connector faces, and/or other third level packages, to provide an electrical connector or other third level package. Thus, embodiments of the invention can be used at any point in a signal path between a signal driver and a signal receiver, including chip-package, package-socket and/or package-package (connector) connections.

When coupling an integrated circuit with a second level package for the integrated circuit using inductive microelectronic interconnects and buried solder bumps, according to some embodiments of the invention, the second inductor on the second level package can have greater inductance compared to the first inductor on the integrated circuit. Moreover, in any of the above embodiments, a DC offset compensating receiver may be provided in at least one of the first and second substrates that is coupled to the corresponding at least one of the first and second AC-coupled interconnect elements. Also, when inductive or inductive/capacitive coupling is used, a current mode driver may be provided in at least one of the first and second substrates that is coupled to the corresponding at least one of the first and second inductors or inductive/capacitive elements.

In some embodiments of the present invention, the buried solder bump is configured to transfer DC power, including a power supply voltage and/or ground, between the first and second substrate. In these embodiments, techniques other than buried solder bumps can be used to provide close spacing and/or alignment, while allowing DC power to be transferred between the first and second substrates. For example, pin-in-socket, land pad, fuzz-ball and/or other connection technologies can be used. These technologies may be used with mechanical and/or optical alignment structures. These technologies are well known to those having skill in the art and need not be described further herein.

In other embodiments, the buried solder bump is configured to transfer signals between the first and second substrate. Moreover, in some embodiments, the first and second AC-coupled interconnect elements comprise first and second AC-coupled signal interconnect elements and in other embodiments they comprise first and second AC-coupled power interconnect elements.

According to yet other embodiments of the invention, inductive coupling may be used for microelectronic signal interconnects, without the need for buried solder bumps. In these embodiments, a first microelectronic substrate includes a first face and a first inductor on the first face. A digital signal driver is included in the first microelectronic substrate that is configured to drive the first inductor with a digital signal. A second microelectronic substrate includes a second face and a second inductor on the second face that is closely spaced apart from the first inductor. A digital signal receiver in the second microelectronic substrate is configured to receive the digital signal from the digital signal driver via inductive coupling between the first and second inductors. The first and second inductors also may include capacitance associated therewith. When the first microelectronic substrate is an integrated circuit, and the second microelectronic substrate is a second level package for the integrated circuit, the second inductor can have greater inductance than the first inductor. The digital signal receiver can be a DC-offset compensating digital signal receiver, and/or the digital signal driver can be a current mode digital signal driver, as was described above. Accordingly, high performance AC-coupled microelectronic interconnects may be provided that can be fabricated reliably in a high volumes.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. It will also be understood that when an element is referred to as being "connected" or "coupled" to another element, it can be directly connected or coupled to the other element or intervening elements may be present. In contrast, when an element is referred to as being "directly coupled" to another element, there are no intervening elements present.

Figure 1:
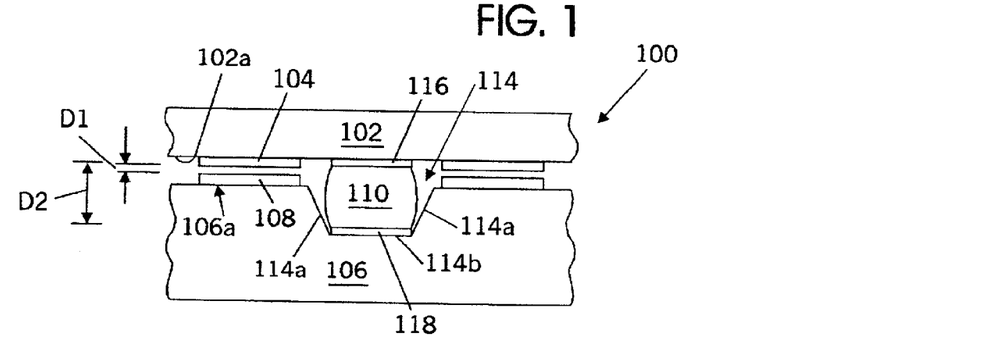
FIG. 1 is a side cross-sectional view of microelectronic packages according to some embodiments of the present invention.

FIG. 1 is a cross-sectional view of microelectronic packages according to embodiments of the present invention. As shown in FIG. 1, these embodiments of microelectronic packages 100 include a first microelectronic substrate 102 including a first face 102a and a first AC-coupled interconnect element 104 on the first face 102a. In some embodiments, the first microelectronic substrate 102 is an integrated circuit chip which may be fabricated from silicon and/or other conventional semiconductor materials using conventional techniques. In other embodiments, the first microelectronic substrate can be any other microelectronic packaging substrate including, for example, a fixedly connected or separable printed circuit board, multi-chip module, interposer, socket connector and/or other conventional microelectronic packaging substrate.

Still referring to FIG. 1, a second microelectronic substrate 106 includes a second face 106a and a second AC-coupled interconnect element 108 on the second face 106a. In some embodiments, the second microelectronic substrate is a second level package, such as a fixedly connected or separable board, multi-chip module, interposer, socket connector and/or other conventional second level package. In other embodiments, the second microelectronic substrate can be an integrated circuit that may be fabricated from conventional semiconductor and/or other microelectronic materials.

The first and second AC-coupled interconnect elements 104 and 108, respectively, may comprise a first capacitor plate and a second capacitor plate, respectively, a fast inductor and a second inductor, respectively, and/or a first combined inductive and capacitive element and a second combined inductive and capacitive element, respectively. As shown in FIG. 1, a plurality of first and second AC-coupled interconnect elements 104 and 108, respectively, may be provided. The plurality of first and second AC-coupled interconnect elements need not be the same in size, shape and/or coupling mechanism (inductance, capacitance and/or inductance/capacitance). In other embodiments, they can be the same. It also will be understood that a dielectric layer may be provided on the first and/or second AC-coupled interconnect elements 104 and 108, respectively, opposite the respective substrates 102 and 106. The dielectric layer can comprise silicon dioxide, silicon nitride, polyimide, high dielectric constant materials and/or other dielectric materials. The dielectric layer(s) can fill the gap between the first and second AC-coupled interconnect elements 104 and 108, respectively, and can reduce or prevent spurious shorting between opposing AC-coupled interconnect elements. In some embodiments, conventional chip overglass may be used, with or without a thin air gap.

Still continuing with the description of FIG. 1, a buried solder bump 110 extends between the first and second faces 102a and 106a, respectively, and is at least partially buried beneath at least one of the first and second faces 102a and 106a, respectively, to maintain the first and second AC-coupled interconnect elements 104 and 108, respectively, in closely spaced apart relation and/or in lateral alignment. Stated differently, the buried solder bump 110 can provide an embodiment of means for maintaining the first and second AC-coupled interconnect elements 104 and 108, respectively, spaced apart from one another by a distance D1 that is less than the thickness D2 of the solder bump 110. However, other embodiments also may be provided, including, for example, pins, optical alignment and glue, land pads, fuzz-balls and/or other techniques well known to those having skill in the art.

As will be described in detail below, in some embodiments, the buried solder bump can provide coupling of DC power, such as a power supply voltage and/or ground, between the substrates, in addition to or instead of facilitating spacing and/or alignment. Other technologies also may serve the dual purpose of mechanical alignment/spacing and electrical DC power transfer, including pins, land pads and/or fuzz-balls.

In FIG. 1, an embodiment of a buried solder bump 110 is provided by a trench 114 in the second face, including a buried trench floor 114b beneath the second face 106a and a trench sidewall 114a between the second face 106a and the buried trench floor 114b. The trench 114 may be formed, for example, using conventional wet and/or dry etching and/or other conventional techniques. The buried solder bump 110 extends between the trench floor 114b and the first face 102a. It will be understood that the trench 114 may be of any suitable size and/or dimensions. For example, although the trench 114 is illustrated in FIG. 1 as having a flat floor 114b and oblique sidewalls 114a, the floor need not be flat, and the sidewalls need not be flat, oblique, of the same angle or of the same size. Other trench configurations, such as a V-shaped trench, a cylindrical trench, a hemispherical trench and/or a truncated hemispherical trench also may be provided. The trench 114 need not be elongated, but rather can have equal size sidewalls 114a.

Finally, still referring to FIG. 1, a first solder bump pad 116 is provided on the first face 102a, and a second solder bump pad 118 is provided on the trench floor 114b. The buried solder bump 110 extends between the first solder bump pad 116 and the second solder bump pad 118. It will be understood that, as used herein, the term "solder bump pad" may include any conventional structure that is used as a base and/or anchor for a solder bump, and may include wettable and/or nonwettable layers, underbump metallurgy and/or other conventional structures. The solder bump pad may extend beyond the floor 114b onto the sidewalls 114a, and may be fabricated, for example, using conventional metallization techniques. Moreover, the solder bump 110 may be a conventional eutectic lead-tin solder bump, other lead-tin solder bump compositions, and/or any other solder bump compositions, and may be fabricated using plating and/or other conventional techniques. Multiple solder bumps may be used.

A discussion of potential advantages of microelectronic packages, such as microelectronic packages 100 according to embodiments of the present invention, now will be provided. Conventional solder bump technologies may produce a significant standoff relative to the substrates that are being connected. This standoff may present a significant discontinuity to AC signals, such as radio frequency signals, and may make it difficult to use AC-coupled interconnects.

In sharp contrast, embodiments of the present invention, such as illustrated in FIG. 1, may provide buried solder bumps 110 that can be flip-chip aligned and reflowed, so that the surface tension of the solder bump 110 can naturally align the first and second substrates 102 and 106, and bring the first and second AC-coupled interconnect elements 104 and 108 into close proximity. Embodiments of the invention can align the first and second AC-coupled interconnect elements 104 and 108 to micron accuracy. The volume of the solder bump 110 and/or the etch depth of the trench 114 can be precisely controlled to control vertical standoff. The solder bump surface tension can provide horizontal alignment accuracy to the lithographic resolution that is used to produce the opposing solder bump pads 116 and 118. The vertical standoff distance D1 can be made very uniform across the faces 102a and 106a of the substrates 102 and 106, respectively.

Good mechanical performance also may be provided, because the mechanical properties of the interface can be similar or identical to that of a standard flip-chip interface. Thus, a solder bump of sufficient thickness D2 may be used to absorb differences between thermal coefficient mismatches between the first and second substrates 102 and 106, respectively. A compliant mechanical interface thereby may be provided. Finally, good thermal performance also may be provided. In particular, with a reduction in the air gap that normally is associated with flip-chip solder bumps, thermal performance can be substantially improved.

Figure 2:
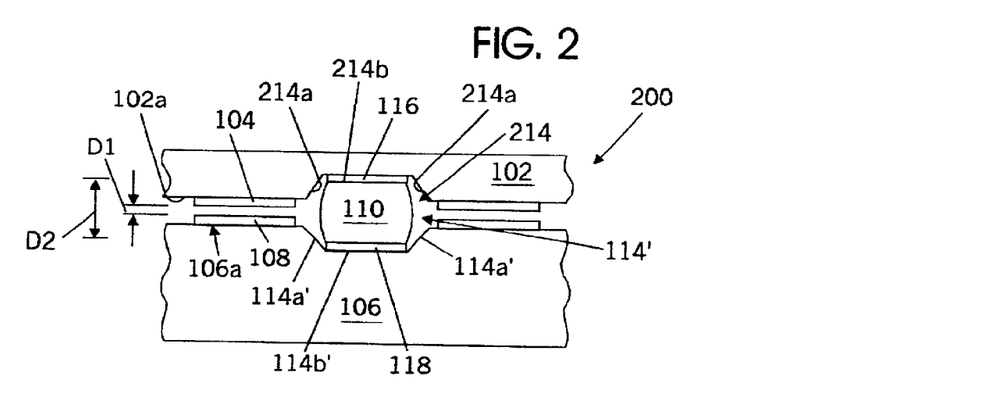
FIG. 2 is a side cross-sectional view of microelectronic packages according to other embodiments of the present invention.

FIG. 2 is a cross-sectional view of other embodiments of microelectronic packages according to the invention. As shown in FIG. 2, these embodiments of microelectronic packages 200 may be similar to packages 100 as shown in FIG. 1, except that the buried solder bump 110 is obtained by providing a first trench 214 in the first face 102a of the first substrate 102, and a second trench 114' in the second face 106a of the second substrate 106. The first trench 214 may include a first trench floor 214b and first trench sidewalls 214a, and the second trench 114' may include a second trench floor 114b' and second trench sidewalls 114a', which may be the same or different dimensions as the corresponding trench 114 of FIG. 1. The first trench 214 may be the same or different in size and/or configuration from the second trench 114'. The trench floors need not be flat and need not be present, and the trench sidewalls need not be oblique or of equal size or shape, as was already described.

Figure 3:
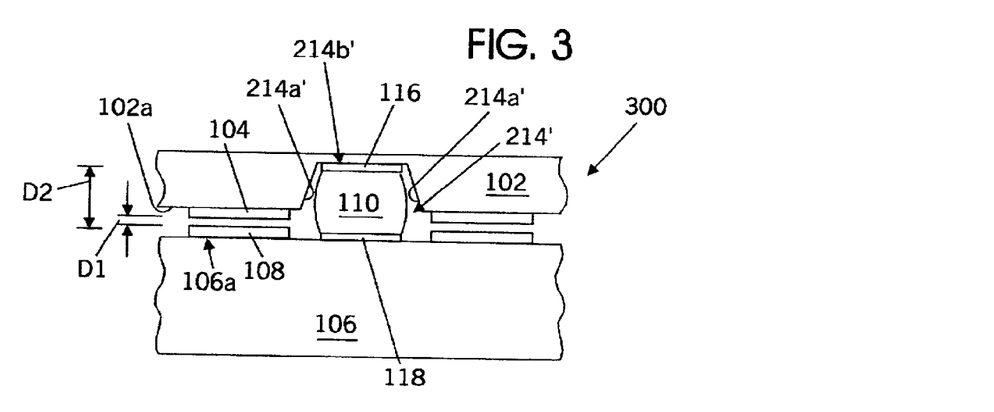
FIG. 3 is a side cross-sectional view of microelectronic packages according to still other embodiments of the present invention.

FIG. 3 is a cross-sectional view of yet other embodiments of microelectronic packages 300 according to the present invention. In these embodiments, a second trench 114/114' is not provided in the second substrate, but a first trench 214' is provided in the first substrate 102. The first trench 214' may be same or different size and/or dimensions as the first trench 214 of FIG. 2, and may include a floor 214b' and/or sidewalls 214a', as was already described.

Figure 4:
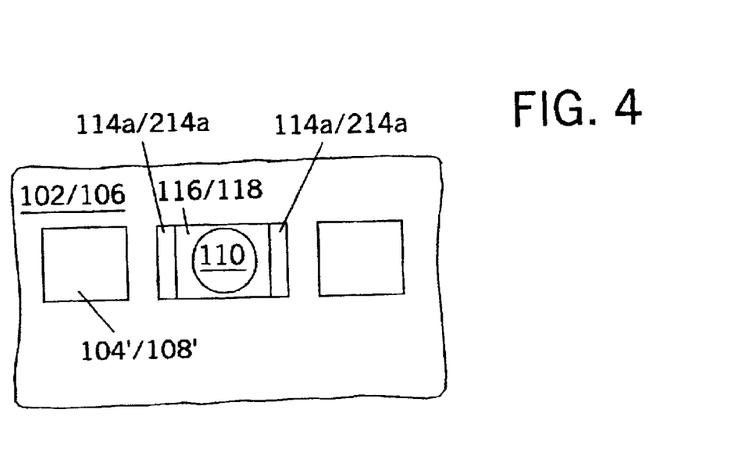
FIG. 4 is a plan view of microelectronic packages according to some embodiments of the present invention.

FIG. 4 is a plan view of the substrates 102 or 106 of FIGS. 1–3 according to embodiments of the present invention. FIG. 4 illustrates the first or second microelectronic substrate 102 or 106 including a solder bump 110, a first or second pad 116 or 118 and trench sidewalls 114a or 214a. In FIG. 4, the first and second AC-coupled interconnect elements 104 or 108 comprise first and second capacitor plates 104' or 108'. In FIG. 4, the first and second capacitor plates 104' or 108' are shown as being square. However, other equal and/or unequal shapes and/or sizes may be used. The design of capacitor plates 104' or 108' is well known to those having skill in the art and need not be described further herein.

Figure 5:
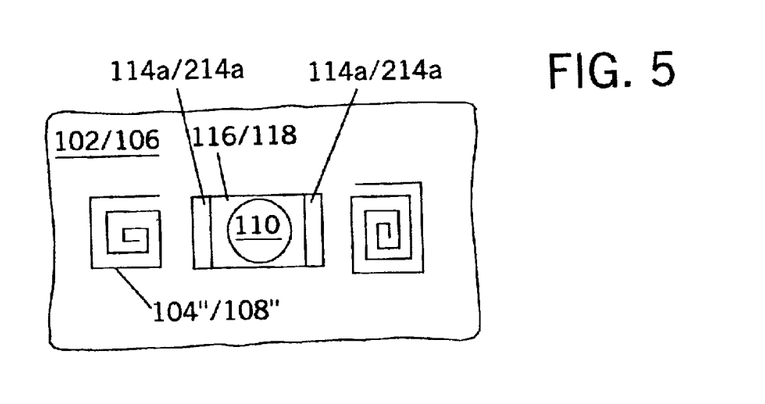
FIG. 5 is a plan view of microelectronic packages according to yet other embodiments of the present invention.

FIG. 5 illustrates a similar plan view as FIG. 4, except that the first and second AC-coupled interconnect elements 104 or 108 comprise first and second inductors 104" or 108". Although the first and second inductors 104" or 108" are shown as spiral inductors, other conventional inductor configurations may be used, including multilayer inductors. Moreover, the overall size, spacing, number of turns and/or other parameters may be varied, to provide a desired inductance, using techniques well known to those having skill in the art. It also will be understood that first and second AC-coupled interconnect elements 104 and/or 108 may be provided that combine both capacitive and inductive coupling using techniques known to those having skill in the art. For example, it is known that inductors 104" or 108" of FIG. 5 may have significant capacitance associated therewith, as well.

Figure 6:
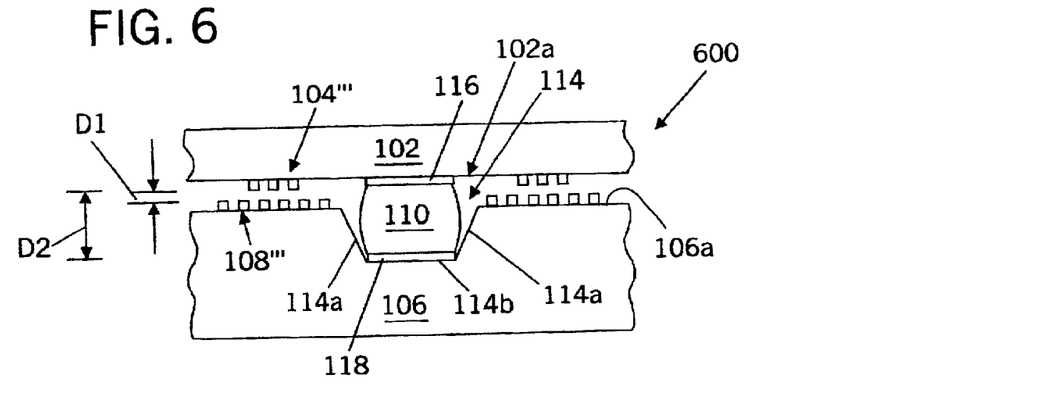
FIG. 6 is a side cross-sectional view of microelectronic packages according to some embodiments of the present invention.

FIG. 6 is a cross-sectional view of other embodiments of microelectronic packages according to the invention. In these microelectronic packages 600, the first and second AC-coupled interconnect elements 104 and 108 are first and second inductors 104''' and 108''', respectively, where the second inductor 108''' has greater inductance than the first inductor 104'''. In one example, the inductance of the second inductor 108''' can be up to about two times greater than the first inductor 104'''. In another example, the first inductor 104''' can be 5 nH and the second inductor 108''' can be 7 nH. This is illustrated in FIG. 6 by the second inductor 108''' having more turns than the first inductor 104'''. However, other techniques for providing greater inductance may be used.

Embodiments such as FIGS. 5 and 6 that provide inductive coupling may provide a lower impedance compared to embodiments that provide capacitive coupling, such as FIG. 4. For example, capacitive coupling may provide an impedance of about 1000 Ω, which may need to be matched to a conventional driver or receiver, for example using a conventional 50 Ω transmission line. In sharp contrast, a series inductor, with or without capacitance, may allow a coupling structure having an overall impedance that is about 50 Ω, so that the need for matching can be reduced or eliminated. Thus, inductors may be placed on a substrate with more freedom, because matching elements may not need to be provided. Moreover, as shown in FIG. 6, asymmetric inductors may be provided. In particular, when the substrate 102 is an integrated circuit chip and the substrate 106 is a second level package, such as a multi-chip module or board, the size of the inductor 104''' on the chip 102 may be small relative to the inductor 108''' on the second level package 106. This can preserve valuable chip real estate and further aid in impedance matching.

Figure 7:
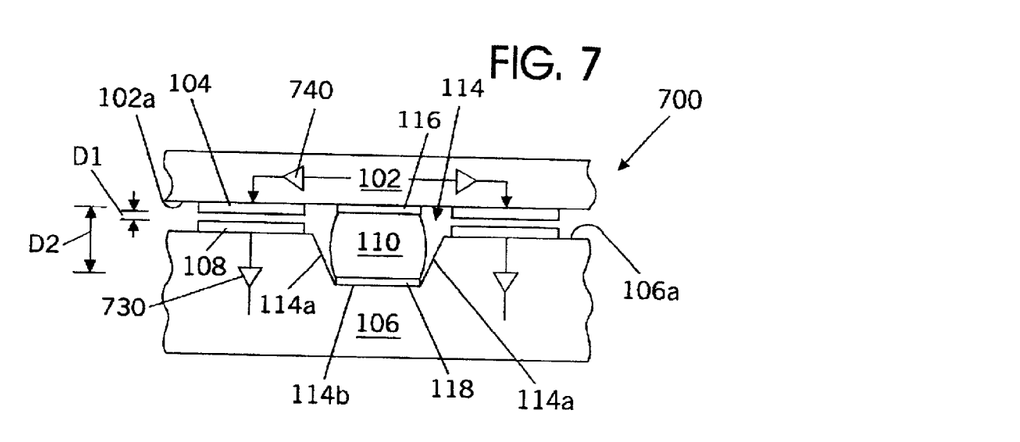
FIG. 7 is a side cross-sectional view of microelectronic packages according to yet other embodiments of the present invention.

FIG. 7 is a cross-sectional view illustrating internal circuitry that may be used in the first and/or second substrates according to other embodiments of the invention. In particular, as shown in FIG. 7, microelectronic packages 700 according to these embodiments of the invention may include a DC offset compensating receiver 730 in at least one of the first and second substrates 102 or 106 that is coupled to the corresponding at least one of the AC-coupled interconnect elements 104 and/or 108. In other embodiments, when the first and/or second AC-coupled interconnect elements comprise inductors, a current mode driver 740 may be used in at least one of the first and second microelectronic substrates 102 and/or 106 that is coupled to at least one of the first and second AC-coupled interconnect elements 104 and/or 108. It will be understood by those having skill in the art that in other embodiments, the drivers and/or receivers can all be included in one or more integrated circuit chips rather than in the second level package.

DC offset compensating receivers 730 may be used to reduce and preferably prevent drift that may be arise because DC coupling is not present. Thus, the DC offset compensating receivers 730 can be used to reduce the effect of DC offsets. The design of DC offset compensating receivers 730 are well known to those having skill in the art and need not be described further herein. Moreover, since inductors are primarily current driven devices, it may be desirable to include a current mode driver 240 for the inductors. As is well known to those having skill in the art, a current mode driver can transmit binary signals using two different current levels, as opposed to a conventional voltage mode driver that transmits binary signals using two voltage levels. The design of current mode drivers 740 is well known to those having skill in the art and need not be described further herein. Other embodiments may provide encoding of the data being transferred, to reduce the likelihood of long strings of ones or zeros from being transferred and thereby reduce the likelihood of DC offset.

Figure 8:
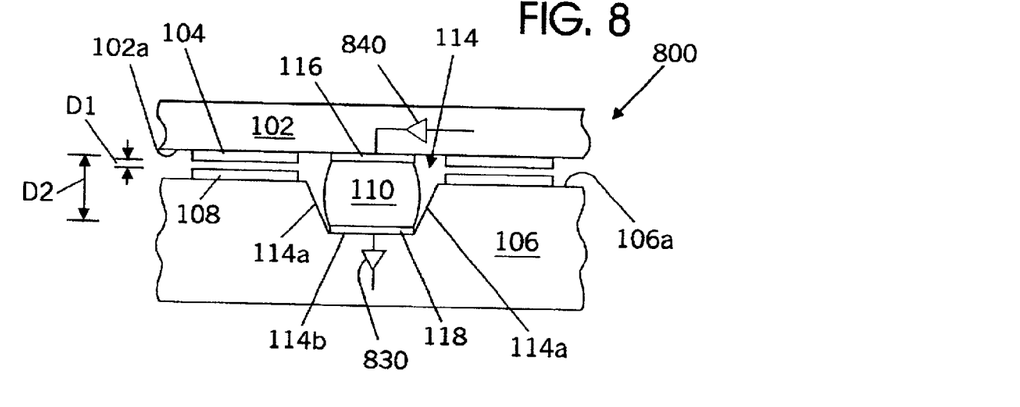
FIG. 8 is a side cross-sectional view of microelectronic packages according to still other embodiments of the present invention.

FIG. 8 is a cross-sectional view of other embodiments of microelectronic packages according to the invention. As shown in FIG. 8, these embodiments of microelectronic packages 800 can be similar to any of the embodiments that were described in connection with FIGS. 1–7. However, the solder bumps and/or other connection technology also may be used to provide direct coupled signal and/or power connections using a driver 840 and/or a receiver 830. Although FIG. 8 illustrates power and/or signals being transferred from the first substrate 102 to the second substrate 106, power and/or signals also may be transferred from the second substrate 106 to the first substrate 102. It also will be understood that in any of the embodiments of FIGS. 1–8, the first and second AC-coupled interconnect elements also may be used to transfer AC power, as well as signals. It will be understood by those having skill in the art that in other embodiments, the drivers and/or receivers can all be included in one or more integrated circuit chips rather than in the second level package.

Figure 9:
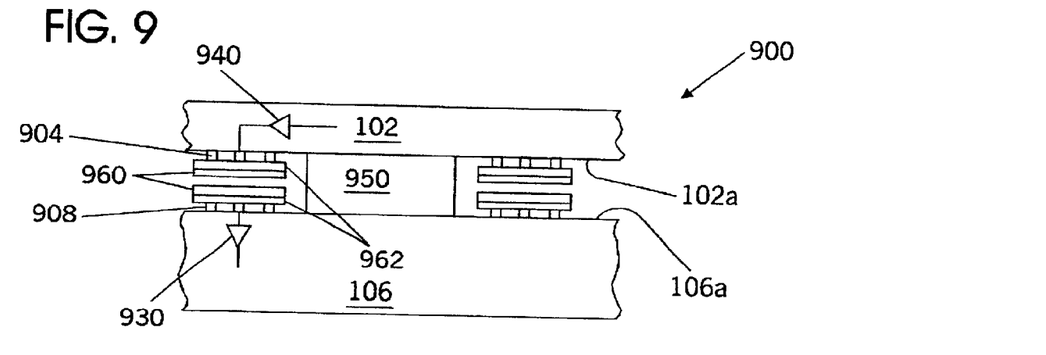
FIG. 9 is a side cross-sectional view of microelectronic packages according to yet other embodiments of the present invention.

FIG. 9 is a cross-sectional view of microelectronic packages according to other embodiments of the present invention. As shown in FIG. 9, these embodiments of microelectronic packages 900 do not use buried solder bumps to couple the first and second substrates 102 and 106. Rather, any conventional coupling system 950 may be used. The coupling system may include studs, spacers, mesas, surface solder bumps, pins and/or other conventional coupling systems.

Still referring to FIG. 9, the first microelectronic substrate includes a first inductor 904 on the first face. A digital signal driver 940 in at least the first microelectronic substrate 102 is configured to drive the first inductor 904 with a digital signal. A second inductor 908, on the second face 106a of the second microelectronic substrate 106, is closely spaced apart from the first inductor 904. A digital signal receiver 930 in at least the second microelectronic substrate 106 is configured to receive the digital signal from the digital signal driver via inductive coupling between the first and second inductors 904 and 908.

As was the case with the previous embodiments, the size and/or configuration of the first and second inductors 904/

908 may be equal or unequal. In some embodiments, the first microelectronic substrate 102 is an integrated circuit and the second microelectronic substrate 106 is a second level package. However, the roles of these packages may be reversed, and other substrates may be used. Moreover, in some embodiments, the second inductor 908 has greater inductance than the first inductor 904. In some embodiments, the digital signal receiver 930 is a DC offset compensating digital signal receiver and/or the digital signal driver 940 is a current mode digital signal driver. Thus, inductive signal interconnects may be used in microelectronic packages.

Finally, still referring to FIG. 9, one or more of the inductors 904 and/or 908 may also be provided with a mutual inductance coupling element 960 that may be insulated from the corresponding inductor by an insulator 962. The insulator 962 can be silicon dioxide, silicon nitride and/or any other dielectric that is conventionally used in microelectronic devices, and the mutual inductance coupling element 960 may comprise nickel and/or other magnetic material. It will be understood that mutual inductance coupling elements 960 of FIG. 9 also may be used with any of the other inductive and/or inductive/capacitive embodiments of FIGS. 1–8. Embodiments of FIG. 9 may have particular utility in connectors and/or sockets, to allow an impedance-matched interface. In these embodiments, the first and second substrates 102 and 106 can be embodied as mating connector elements. It will be understood by those having skill in the art that in other embodiments, the drivers and/or receivers can all be included in one or more integrated circuit chips rather than in the second level package.

Figure 10:
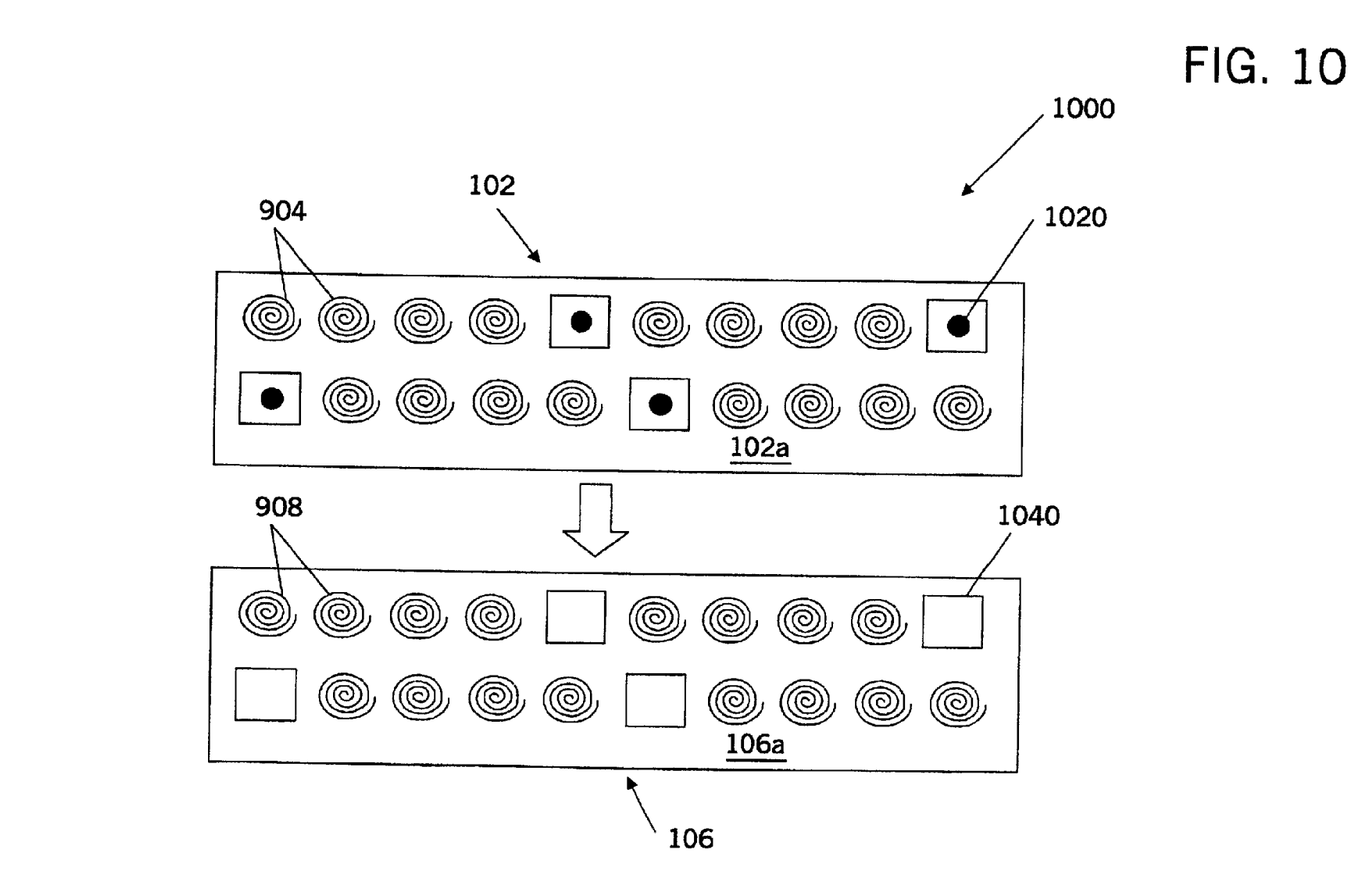
FIG. 10 is a plan view of microelectronic packages according to some embodiments of the present invention.

FIG. 10 illustrates a plan view of fixedly connected or separable mating connector substrates that use inductive coupling elements according to embodiments of the invention. As shown in FIG. 10, the first substrate 102 and the second substrate 106 may be embodied as fixedly connected or separable mating connector substrates. An array of first inductive coupling elements and/or inductive/capacitive coupling elements 904 is provided on the first face 102a of the first mating connector substrate 102, and a corresponding array of second inductive and/or inductive/capacitive coupling elements 908 is provided on the second face 106a of the second mating connector substrate 106. Pins 1020 and pin clips 1040 also may be provided on the first and/or second substrates, to provide a conventional mechanical interface for an electrical connector 1000. Other conventional mechanical interfaces may be provided.

Figure 11:
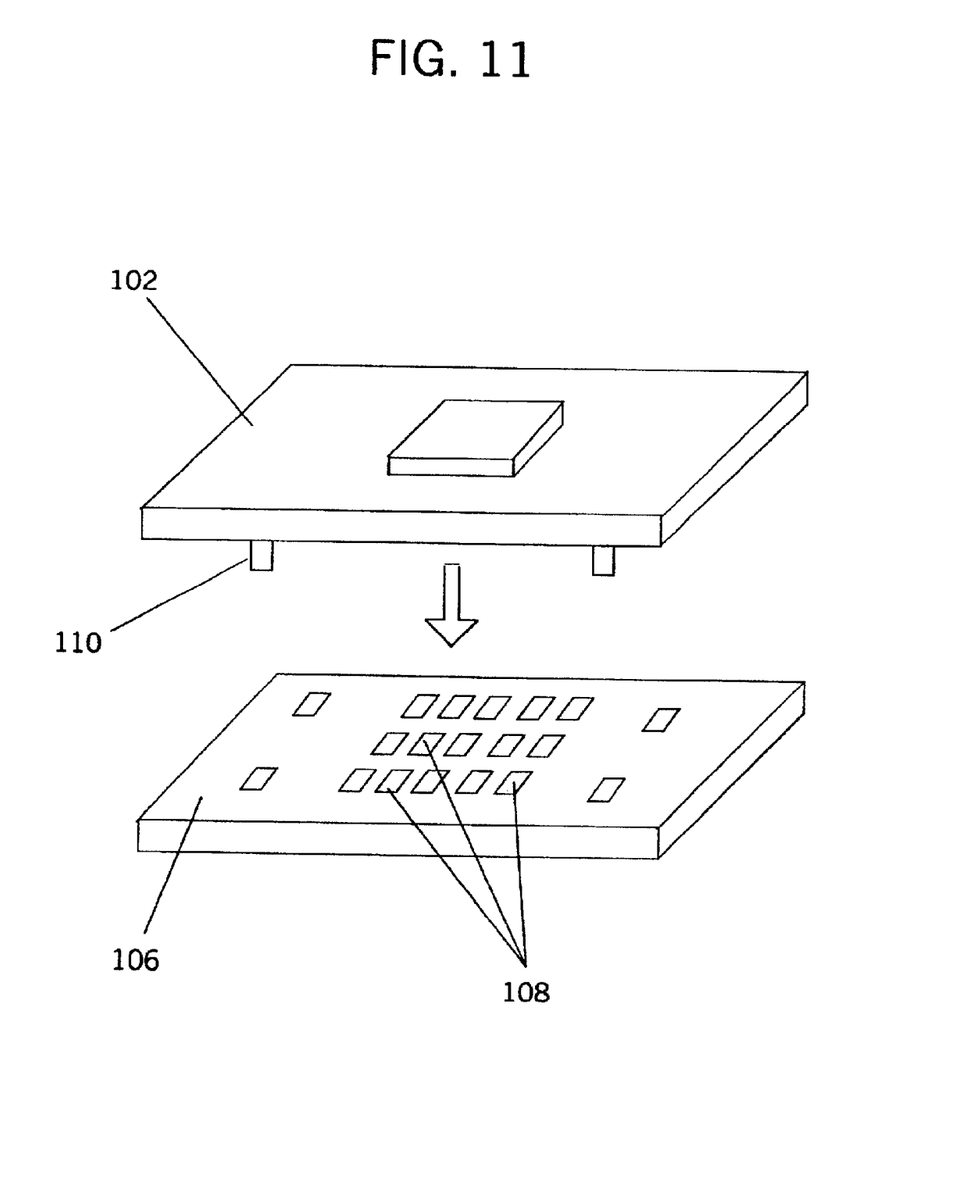
FIG. 11 is a perspective view of microelectronic packages according to embodiments of the invention.

Finally, FIG. 11 is a perspective view of other embodiments of the invention in a socket environment. In particular, in FIG. 11, the first substrate 102 is a chip-in-package, and the second substrate 106 is a socket. An array of second capacitive, inductive and/or inductive/capacitive coupling elements 108 is provided on the second substrate 106, and a corresponding array also is provided on the first substrate 102. Solder bumps 110 and/or other alignment structures as described above may be used to join the chip in package to the socket. Fixed joining or separable joining technologies may be employed.

Accordingly, embodiments of the invention can provide, for example, chip-to-board connections that can provide reliable connection pitches of as little as about 30 $\mu$m or less, with up to multi-gigabit per second or faster signaling on each connection. Input/Output (I/O) densities of the up to about 15,000 I/O per cm$^2$ or more may be provided. Embodiments of the invention can be highly manufacturable, testable and repairable, and can address thermo-mechanical and electrical issues simultaneously.

These needs may be addressed conventionally by solder bump structures having small sizes. However, small solder bumps may lead to compliance issues. Attempts also have been made to produce high-aspect ratio solder bumps to provide compliance, but these may introduce manufacturing cost issues.

In contrast, embodiments of the invention can provide highly manufacturable, testable and/or repairable connections at pitches of, for example, as little as about 30 $\mu$m or less, with, for example, up to multi-gigabit/second or more signaling on each connection, while still addressing thermo-mechanical issues. Pitches as low as about 20 $\mu$m or less also may be used. Moreover, since the connection technology can be compliant, it can be no more difficult to manufacture, test and/or rework than current flip-chip technologies. Moreover, current mode signaling can provide, for example, up to about 50% or more higher bit rate than conventional signaling streams.

Capacitively coupled interconnects also have been disclosed. See, for example, the above-cited U.S. Pat. No. 5,629,838. Capacitively coupled interconnects can offer a high degree of compliance, as the interconnect structure need only include two separated metal plates. However, conventional capacitively coupled interconnects may be limited by the achievable standoff between the two metal capacitor plates. This standoff may be determined by the smallest height bump that may be made to deliver DC power. A large standoff can lead to small series capacitance and, thus, can limit the performance of the interconnect.

In sharp contrast, embodiments of the present invention that employ buried solder bumps can permit almost zero standoff and thus can allow very high coupling capacitance. Plates as small as about 25 $\mu$m$^2$ or less can provide feasible interconnects, with only air as an interplate dielectric. With high dielectric constant materials, such as polyimide, ceramics and/or other dielectrics, the plate area can be decreased proportional to the dielectric constant. Since as much as about 2 $\mu$m interplate spacing can bring the crosstalk down to very low levels, interconnect pitches of about 10–20 $\mu$m or more are potentially possible, depending on the level of external noise sources. Because the opposing plates on the substrate and chip can be separated by a small, for example, about 1 $\mu$m, air gap, the overall structure can be very compliant and, thus, can be easy to manufacture, rework and/or test.

It will be understood that, due to the presence of parasitics, capacitively coupled interconnects can act as a bandpass circuit. This circuit can be tuned even further through the deliberate addition of inductance. The inductance can be built as small spirals instead of plates. Moreover, as was described, a micro-machined magnetic plug, such as a nickel plug, may be included, to allow a very high amount of mutual inductance between the chip and substrate. Since both electric and magnetic fields are coupled, these structures may potentially be made smaller than capacitively coupled circuits.

Buried solder bumps can allow the chip and substrate faces to be separated by an air gap of only a few microns. Moreover, the buried solder bumps can be used to deliver DC power across this face. Thus, the air gap can be kept small, while DC power delivery can remain fairly conventional.

Finally, due to a lack of a DC path, conventional driver and receiver circuits may not be preferred for embodiments of the present invention. In order to at least partially compensate for a lack of a DC path, it may be desirable to use Non-Return-to-Zero (NRZ) tolerant and/or other DC offset compensating receivers that can, for example, use feedback, so as to reduce or prevent the average DC shift that may occur over time when a long string of zeros or ones are sent. Such circuits have been used in optical transceivers, and may also be used with AC-coupled structures according to embodiments of the present invention. Moreover, as was described above, current mode signaling may be used which can provide advantages over voltage mode signaling. Current mode signaling can be faster as the input impedance of the receiver can be small. Also, it can be low noise, because there can be reduced di/dt and/or return path noise.

In conclusion, AC-coupled interconnects according to embodiments of the invention can provide mechanically simple structures that can be scaled down to much smaller sizes than conventional DC-coupled structures. At the same time, by removing the need for making a connection, test probes can similarly be simplified and rework can become straightforward. Thus, AC-coupled interconnects according to embodiments of the invention can potentially offer a very attractive solution for high density I/O.

DC power may be supplied across the face of the chip, for example through a fairly high density of solder bumps, so as to control resistive drop. RF powering also may be used to provide power, but this approach may be relatively inefficient. According to embodiments of the invention, solder bumps buried in micromachined holes can be used to provide the DC connections. The buried solder bumps can be kept fairly large, thus allowing the resistance to be low. The self-aligning capability of the solder bumps can be used to provide alignment without any unusual equipment, attachment fixtures or other techniques. In addition, it is possible to size the solder bumps so that they will pull the chip and substrate into close proximity, thus making the potential air gap very small.

These interconnect structures also can provide a desired level of signal integrity. Simulation results for 25 $\mu$m square capacitor plates at a 30 $\mu$m pitch indicate a signal of at least 300 mV swing reaching the receiver circuit. The AC signal coupled through the structure is proportional of the ratio of the series through-capacitance to the parasitic capacitance to ground.

Parasitic capacitances may be kept low as a function of geometry and layout. The components of the parasitic capacitance may include the capacitance between the conductor plate and ground, as well as the routing between the driver (or receiver) and the plate. Thus, it may be desirable to use thick insulators between the capacitor plate and ground, as is conventionally the case for many flip-chip solder bump designs, and to keep the routing to and from the driver and receiver short. In order to increase or maximize the series capacitance, it may be desirable to keep the gap thickness small and make the dielectric constant as high as possible.

In the drawings and specification, there have been disclosed typical preferred embodiments of the invention and, although specific terms are employed, they are used in generic and descriptive sense only and not for purposes of limitation, the scope of the invention being set forth in the following claims.

What is claimed is:

1. An electrical connector comprising:
    a first mating connector substrate including a first mating connector face;
    a first array of inductors on the first mating connector face;
    a second mating connector substrate including a second mating connector face; and
    a second array of inductors on the second mating connector face;
    the first and second mating connector substrates being configured to maintain the first and second mating connector faces in closely spaced apart relation, to prevent DC coupling and provide inductive AC coupling, between at least one pair of corresponding inductors in the first and second arrays of inductors.

2. An electrical connector according to claim 1 further comprising at least one pin and at least one corresponding pin clip on at least one of the first and second mating connector substrates and configured to maintain the first and second mating connector faces in the closely spaced apart relation.

3. An electrical connector according to claim 1 wherein the inductors in the first and second arrays of inductors also include capacitance associated therewith.

4. An electrical connector according to claim 1 further comprising a DC offset compensating receiver that is coupled to at least one of the inductors in the first and/or second arrays of inductors.

5. An electrical connector according to claim 1 further comprising a current mode driver that is coupled to at least one of the inductors in the first and/or second arrays of inductors.

6. An electrical connector according to claim 1 further comprising a first mutual inductance coupling element on at least one of the inductors in the first array of inductors and a second mutual inductance coupling element on a corresponding at least one of the inductors in the second array of inductors.

7. An electrical connector according to claim 1 wherein the first and second mating connector substrates are configured to separably maintain the first and second mating connector faces in closely spaced apart relation.

8. An electrical connector according to claim 1 wherein the first and second mating connector substrates are configured to fixedly maintain the first and second mating connector faces in closely spaced apart relation.

9. An electrical connector part comprising:
    a first mating connector substrate including a first mating connector face;
    a first array of inductors on the first connector mating face; and
    a mechanical interface that is configured to maintain the first mating connector face in closely spaced apart relation to a second mating connector face having a second array of inductors thereon, to prevent DC coupling and provide inductive AC coupling, between at least one pair of corresponding inductors in the first and second arrays of inductors.

10. An electrical connector part according to claim 9 wherein the mechanical interface comprises at least one pin and/or at least one pin clip on the first mating connector substrate.

11. An electrical connector part according to claim 9 wherein the inductors in the first array of inductors also include capacitance associated therewith.

12. An electrical connector part according to claim 9 further comprising a DC offset compensating receiver that is coupled to at least one of the inductors in the first array of inductors.

13. An electrical connector part according to claim 9 further comprising a current mode driver that is coupled to at least one of the inductors in the first array of inductors.

14. An electrical connector part according to claim 9 further comprising a mutual inductance coupling element on at least one of the inductors in the first array of inductors.

15. An electrical connector part according to claim 9 wherein the mechanical interface is configured to separably maintain the first and second mating connector faces in closely spaced apart relation.

16. An electrical connector according to claim 9 wherein the mechanical interface is configured to fixedly maintain the first and second mating connector faces in closely spaced apart relation.

17. An electrical connector part comprising:
a first mating connector substrate including a first mating connector face;
a first array of inductors on the first connector mating face; and
means for maintaining the first mating connector face in closely spaced apart relation to a second mating connector face having a second array of inductors thereon, to prevent DC coupling and provide inductive AC coupling, between at least one pair of corresponding inductors in the first and second arrays of inductors.

18. An electrical connector part according to claim 17 wherein the means for maintaining comprises at least one pin and/or at least one pin clip on the first mating connector substrate.

19. An electrical connector part according to claim 17 wherein the inductors in the first array of inductors also include capacitance associated therewith.

20. An electrical connector part according to claim 17 further comprising a DC offset compensating receiver that is coupled to at least one of the inductors in the first array of inductors.

21. An electrical connector part according to claim 17 further comprising a current mode driver that is coupled to at least one of the inductors in the first array of inductors.

22. An electrical connector part according to claim 17 further comprising a mutual inductance coupling element on at least one of the inductors in the first array of inductors.

23. An electrical connector part according to claim 17 wherein the means for maintaining comprises means for separably maintaining the first and second mating connector faces in closely spaced apart relation.

24. An electrical connector according to claim 17 wherein the means for maintaining comprises means for fixedly maintaining the first and second mating connector faces in closely spaced apart relation.

25. An electrical connector comprising:
a first mating connector substrate including a first mating connector face;
a first array of inductors on the first mating connector face;
a second mating connector substrate including a second mating connector face;
a second array of inductors on the second mating connector face; and
a DC offset compensating receiver that is coupled to at least one of the inductors in the first and/or second arrays of inductors;
the first and second mating connector substrates being configured to maintain the first and second mating connector faces in closely spaced apart relation to provide inductive coupling between corresponding inductors in the first and second arrays of inductors.

26. An electrical connector comprising:
a first mating connector substrate including a first mating connector face;
a first array of inductors on the first mating connector face;
a second mating connector substrate including a second mating connector face;
a second array of inductors on the second mating connector face; and
a current mode driver that is coupled to at least one of the inductors in the first and/or second arrays of inductors;
the first and second mating connector substrates being configured to maintain the first and second mating connector faces in closely spaced apart relation to provide inductive coupling between corresponding inductors in the first and second arrays of inductors.

27. An electrical connector part comprising:
a first mating connector substrate including a first mating connector face;
a first array of inductors on the first connector mating face;
a mechanical interface that is configured to maintain the first mating connector face in closely spaced apart relation to a second mating connector face having a second array of inductors thereon, to provide inductive coupling between corresponding inductors in the first and second arrays of inductors; and
a DC offset compensating receiver that is coupled to at least one of the inductors in the first array of inductors.

28. An electrical connector part comprising:
a first mating connector substrate including a first mating connector face;
a first array of inductors on the first connector mating face;
a mechanical interface that is configured to maintain the first mating connector face in closely spaced apart relation to a second mating connector face having a second array of inductors thereon, to provide inductive coupling between corresponding inductors in the first and second arrays of inductors; and
a current mode driver that is coupled to at least one of the inductors in the first array of inductors.

29. An electrical connector part comprising:
a first mating connector substrate including a first mating connector face;
a first array of inductors on the first connector mating face;
means for maintaining the first mating connector face in closely spaced apart relation to a second mating connector face having a second array of inductors thereon, to provide inductive coupling between corresponding inductors in the first and second arrays of inductors; and
a DC offset compensating receiver that is coupled to at least one of the inductors in the first array of inductors.

30. An electrical connector part comprising:
a first mating connector substrate including a first mating connector face;
a first array of inductors on the first connector mating face;
means for maintaining the first mating connector face in closely spaced apart relation to a second mating connector face having a second array of inductors thereon, to provide inductive coupling between corresponding inductors in the first and second arrays of inductors; and
a current mode driver that is coupled to at least one of the inductors in the first array of inductors.

* * * * *